United States Patent
Qian et al.

(10) Patent No.: US 9,624,578 B2
(45) Date of Patent: Apr. 18, 2017

(54) METHOD FOR RF COMPENSATION IN PLASMA ASSISTED ATOMIC LAYER DEPOSITION

(71) Applicant: Lam Research Corporation, Fremont, CA (US)

(72) Inventors: Jun Qian, Sherwood, OR (US); Frank L. Pasquale, Beaverton, OR (US); Adrien LaVoie, Newberg, OR (US); Chloe Baldasseroni, Portland, OR (US); Hu Kang, Tualatin, OR (US); Shankar Swaminathan, Beaverton, OR (US); Purushottam Kumar, Hillsboro, OR (US); Paul Franzen, West Linn, OR (US); Trung T. Le, Vancouver, WA (US); Tuan Nguyen, Beaverton, OR (US); Jennifer Petraglia, Portland, OR (US); David Charles Smith, Lake Oswego, OR (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/502,947

(22) Filed: Sep. 30, 2014

(65) Prior Publication Data
US 2016/0090650 A1  Mar. 31, 2016

(51) Int. Cl.
C23C 16/455 (2006.01)
C23C 16/44 (2006.01)
(Continued)

(52) U.S. Cl.
CPC .... *C23C 16/45544* (2013.01); *C23C 16/4401* (2013.01); *C23C 16/4404* (2013.01);
(Continued)

(58) Field of Classification Search
CPC ........ C23C 16/45525; C23C 16/45527; C23C 16/45536
See application file for complete search history.

(56) References Cited

U.S. PATENT DOCUMENTS 6,051,284 A * 4/2000 Byrne ................ C23C 16/5096
                                                        118/671
7,479,191 B1  1/2009 Entley et al.
(Continued)

OTHER PUBLICATIONS

Profijt, H.B., et al., "Plasma-Assisted Atomic Layer Deposition: Basics, Opportunities, and Challenges". J. Vac. Sci. Technol. A 29(5), Sep./Oct. 2011, pp. 1-26.*
(Continued)

*Primary Examiner* — Bret Chen
(74) *Attorney, Agent, or Firm* — Weaver Austin Villeneuve & Sampson LLP

(57) ABSTRACT

Methods for depositing film on substrates are provided. In these embodiments, the substrates are processed in batches. Due to changing conditions within a reaction chamber as additional substrates in the batch are processed, various film properties may trend over the course of a batch. The methods herein can be used to address the trending of film properties over the course of a batch. More specifically, film property trending is minimized by changing the amount of RF power used to process substrates over the course of the batch. Such methods are sometimes referred to as RF compensation methods.

13 Claims, 12 Drawing Sheets

(51) Int. Cl.
*C23C 16/52* (2006.01)
*C23C 16/509* (2006.01)

(52) U.S. Cl.
CPC .... *C23C 16/45536* (2013.01); *C23C 16/5096* (2013.01); *C23C 16/52* (2013.01)

(56) References Cited

U.S. PATENT DOCUMENTS

| | | | |
|---|---|---|---|
| 8,262,800 B1 | 9/2012 | Wongsenakhum et al. | |
| 8,591,659 B1 | 11/2013 | Fang et al. | |
| 8,728,956 B2 | 5/2014 | LaVoie et al. | |
| 2002/0076481 A1* | 6/2002 | Chiang | C23C 16/0227 427/8 |
| 2004/0001787 A1* | 1/2004 | Porshnev | B01D 53/68 423/210 |
| 2006/0156979 A1* | 7/2006 | Thakur | C23C 16/45546 118/715 |
| 2006/0169669 A1* | 8/2006 | Zojaji | B08B 7/0035 216/58 |
| 2010/0089870 A1* | 4/2010 | Hiroshima | C23C 16/45574 216/68 |
| 2011/0256726 A1* | 10/2011 | LaVoie | C23C 16/045 438/702 |
| 2012/0048821 A1* | 3/2012 | Kapla | B65D 21/062 211/126.7 |
| 2012/0328771 A1* | 12/2012 | Papasouliotis | H01J 37/32972 427/8 |
| 2013/0260057 A1* | 10/2013 | Wu | C23C 16/505 427/569 |
| 2014/0030444 A1 | 1/2014 | Swaminathan et al. | |
| 2014/0053867 A1 | 2/2014 | Fang et al. | |
| 2014/0069459 A1 | 3/2014 | Guan et al. | |
| 2014/0087093 A1* | 3/2014 | Kilpi | C23C 16/403 427/569 |
| 2014/0113457 A1* | 4/2014 | Sims | H01L 21/02167 438/792 |
| 2014/0120737 A1* | 5/2014 | Swaminathan | C23C 16/45527 438/765 |
| 2014/0134827 A1 | 5/2014 | Swaminathan et al. | |
| 2014/0209562 A1 | 7/2014 | LaVoie et al. | |
| 2015/0007770 A1 | 1/2015 | Chandrasekharan et al. | |

OTHER PUBLICATIONS

Kaariainen, Tommi O., et al., "Plasma-Assisted Atomic Layer Deposition of Al2O3 at Room Temperatures". Plasma Processes and Polymers, 2009, 6, S237-S241.*

U.S. Patent Application titled "Chamber Undercoat Preparation Method for Low Temperature ALD Films," filed Nov. 25, 2013, U.S. Appl. No. 14/089,653, by Kang, et al.

U.S. Patent Application titled "Method and Apparatus for the Reduction of Defectivity in Vapor Deposited Films," filed Jan. 17, 2014, U.S. Appl. No. 14/158,536, by Dhas, et al.

U.S. Patent Application titled "Multi-Station Plasma Reactor With RF Balancing," filed Aug. 12, 2014, U.S. Appl. No. 14/458,135, by Kapoor, et al.

U.S. Patent Application titled "Methods and Apparatus for Cleaning Deposition Reactors," filed Aug. 12, 2014, U.S. Appl. No. 13/571,232, by Wongsenakhum, et al.

* cited by examiner

METHOD FOR RF COMPENSATION IN PLASMA ASSISTED ATOMIC LAYER DEPOSITION

BACKGROUND

The fabrication of integrated circuits includes many diverse processing steps. One of the operations frequently employed is the deposition of a dielectric film. The film may be deposited on a relatively flat substrate, or it may be deposited into a gap between features patterned over or into silicon substrates. One method of depositing such a film is through plasma assisted atomic layer deposition (PAALD). In this type of method, several operations are undertaken in a cyclic manner to deposit a conformal film. Typically, PAALD processes include the steps of (a) providing a dose of a first reactant to a reaction chamber, (b) purging the reaction chamber, (c) flowing a second reactant to the reaction chamber, (d) igniting a plasma in the reaction chamber, and (e) extinguishing the plasma and purging the reaction chamber. As a result of the nature of precursor delivery/adsorption onto the substrate surface, a single cycle of a PAALD process typically deposits about a monolayer of material. The operations may be repeated a number of times to deposit additional monolayers to reach a desired film thickness.

SUMMARY

Certain embodiments herein relate to methods and apparatus for depositing film on a batch of substrates in a reaction chamber. The film may be deposited through plasma assisted atomic layer deposition processes.

In one aspect of the embodiments herein, a method is provided for depositing film on a batch of substrates in a reaction chamber. The method may include depositing film on each substrate in the batch, where depositing film on each substrate includes flowing one or more reactants into the reaction chamber in vapor form, and supplying an RF power to generate a plasma and exposing the substrate to the plasma to drive a reaction that deposits the film on the substrate; where the RF power per substrate supplied to generate the plasma changes as additional substrates in the batch are processed to thereby account for changes in the reaction chamber as the additional substrates are processed.

In various embodiments, the RF power supplied to generate the plasma changes based on a calibration procedure performed prior to depositing film on the substrates in the batch. The the calibration procedure may include: (a) depositing film on a test batch of substrates and recording a resulting film thickness for each substrate in the test batch, (b) depositing film on a second set of substrates at various levels of RF power and recording a resulting film thickness for each substrate in the second set of substrates, (c) determining a relationship between the RF power and the resulting film thicknesses from operation (b), (d) using the relationship from operation (c) and the film thicknesses from operation (a) to determine an effective RF power for the substrates in the test batch, and (e) determining a specified RF power to supply to each substrate in one or more future batches based, at least in part, on the effective RF power for the substrates in the test batch. The one or more future batches in (e) may include the batch for which the method is performed.

In some embodiments, the calibration procedure further includes: during (a), depositing film on each substrate in the test batch at a first RF power, during (e), determining the specified RF power to supply to each substrate in the one or more future batches by dividing the square of the first RF power by the effective RF power from operation (d) for the substrates in the test batch.

Operation (e) may include determining a specified RF power to supply to each substrate in the one or more future batches based, at least in part, on a recorded chamber accumulation for the substrates in the test batch in operation (a). The specified RF power to supply to each substrate in the one or more future batches may be based, at least in part, on chamber accumulation that occurs during the future batch. Operation (e) may further include performing a statistical analysis to derive a mathematical relationship between the specified RF power and chamber accumulation, and may further include using the mathematical relationship to control the RF power supplied during deposition on the substrates in the batch for which the method is performed. In some embodiments, the mathematical relationship includes a third degree polynomial relationship. In certain implementations, each of the batch and the test batch each include at least about 100 substrates. In various embodiments, operation (c) includes performing a statistical analysis to determine a linear relationship between the RF power and the resulting film thicknesses from operation (b).

In certain cases, the batch may include at least about 100 substrates, and the films deposited on the substrates in the batch may have thicknesses that differ by about 1% or less. In these or other cases, the batch may include at least about 100 substrates, where the films deposited on the substrates in the batch have wet etch rates that differ by about 5% or less.

The substrates are generally processed in a batch, and certain additional operations may take place during each batch. For instance, in some cases, after depositing film on each substrate in the batch, the method may include cleaning the reaction chamber to remove material accumulated on interior surfaces of the reaction chamber. Further, after cleaning the reaction chamber, the method may include depositing an undercoat on interior surfaces of the reaction chamber. A pre-coat may be deposited as well.

In another aspect of the disclosed embodiments, an apparatus for depositing film on substrates in a batch is provided, the apparatus including: a reaction chamber; one or more inlets for providing vapor phase reactants to the reaction chamber; a substrate support; an RF generator configured to generate a plasma using RF power; and a controller including instructions to change the RF power supplied by the RF generator as additional substrates in the batch are processed to account for changes in the reaction chamber that occur as the additional substrates in the batch are processed.

In various embodiments, the instructions to change the RF power are based on a calibration procedure. The controller may further include instructions to perform the calibration procedure by: (a) depositing film on a test batch of substrates and recording a resulting film thickness for each substrate in the test batch, (b) depositing film on a second set of substrates at various levels of RF power and recording a resulting film thickness for each substrate in the second set of substrates, (c) determining a relationship between the RF power and the resulting film thicknesses from operation (b), (d) using the relationship from operation (c) and the film thicknesses from operation (a) to determine an effective RF power for the substrates in the test batch, and (e) determining a specified RF power to supply to each substrate in one or more future batches based, at least in part, on the effective RF power for the substrates in the test batch, where the instructions to change the RF power supplied by the RF generator as the additional substrates in the batch are processed include instructions to apply the specified RF power from operation (e).

The instructions to perform the calibration procedure may further include instructions for: during (a), depositing film on each substrate in the test batch at a first RF power, and during (e), determining the specified RF power to supply to each substrate in the one or more future batches by dividing the square of the first RF power by the effective RF power from operation (d) for the substrates in the test batch.

In certain implementations, operation (e) includes determining a specified RF power to supply to each substrate in the one or more future batches based, at least in part, on a recorded chamber accumulation for the substrates in the test batch in operation (a). While the calibration procedure is often performed on the same reaction chamber in which the batch of substrates is processed, in some embodiments the calibration procedure is performed in a second reaction chamber. The instructions to change the RF power supplied by the RF generator may include changing the RF power based on a changing amount of accumulation within the reaction chamber as the additional substrates in the batch are processed.

These and other features will be described below with reference to the associated drawings.

DETAILED DESCRIPTION

Figure 1:
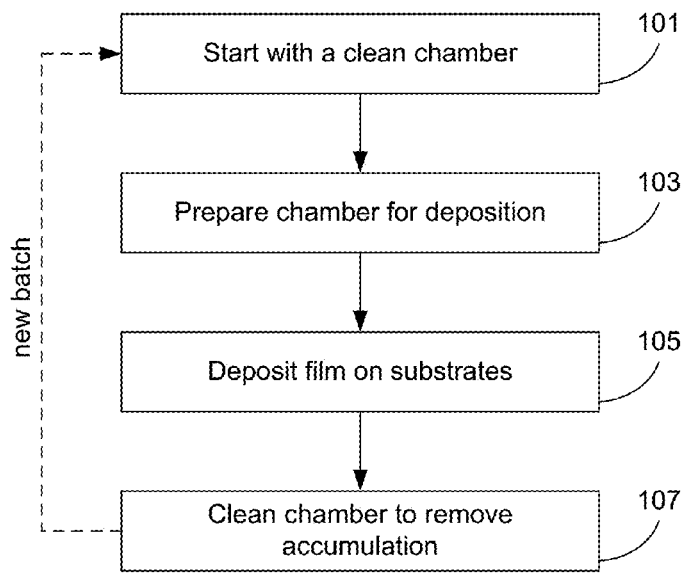
FIG. 1 illustrates a flowchart showing operations that occur during an ALD batch.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more thin films on a planar or non-planar substrate in an integrated fabrication process. In some aspects of the integrated process it may be useful to deposit thin films that conform to substrate topography. One type of reaction that is useful in some cases involves chemical vapor deposition (CVD). In typical CVD processes, gas phase reactants are introduced into a reaction chamber simultaneously and undergo a gas-phase reaction. The reaction products deposit on the surface of the substrate. The reaction may be driven by plasma, in which case the process may be referred to as a plasma enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may cause "bread-loafing" deposition effects that show thicker deposition at top surfaces (e.g., top surfaces of gate stacks) and thinner deposition at recessed surfaces (e.g., bottom corners of gate stacks). Further, because some die may have regions of differing device density, mass transport effects across the substrate surface may result in within-die and within-wafer thickness variations. These thickness variations can result in over-etching of some regions and under-etching of other regions, which can degrade device performance and die yield. Another problem related to CVD processes is that they are often unable to form conformal films in high aspect ratio features. This issue is increasingly problematic as device dimensions continue to shrink.

Another type of reaction that is useful in many cases is atomic layer deposition (ALD). Whereas CVD processes primarily employ gas phase reactions to quickly deposit material on a substrate surface, ALD processes primarily involve surface-mediated reactions that deposit material in a much slower, cyclic manner. One type of ALD process is a plasma assisted atomic layer deposition (PAALD) process, where the reaction is driven by exposure to plasma. In ALD processes, the reactants are delivered in a cyclic manner to minimize or eliminate unwanted gas phase reactions. A typical ALD reaction involves (1) exposing a substrate in a reaction chamber to a first gas phase reactant (e.g., a silicon-containing reactant or a metal-containing reactant, for example) and allowing the reactant to adsorb onto the substrate surface, (2) purging the reaction chamber (e.g., by applying vacuum to evacuate the chamber or by flowing an inert gas to sweep the first reactant out of the chamber), (3) exposing the substrate to a second gas phase reactant (e.g., an oxygen-containing reactant, nitrogen-containing reactant, and/or carbon-containing reactant, for example), (4) exposing the substrate to an energy source (e.g., plasma or heat) to drive a surface reaction between the first reactant and the second reactant, and (5) purging the reaction chamber again. These steps may be repeated to build a film of desired thickness. In various cases, steps (3) and (4) overlap, wholly or partially, such that the second reactant is delivered to the reaction chamber while the substrate is exposed to plasma. ALD processes are also sometimes referred to as conformal film deposition (CFD) processes, particularly where no purge (or an incomplete purge) is done between steps (3) and (4), where steps (3) and (4) overlap in time, or where step (3) occurs continuously. As used herein, the term ALD includes thermal ALD, PAALD, and CFD unless otherwise indicated.

Depending on the exposure time of the precursor dosing steps and the sticking coefficients of the precursors, each ALD cycle may deposit a film layer of, in one example, between about 0.5-3 Å thick.

Methods for forming films using ALD/CFD are described in the following U.S. patent applications, each of which is herein incorporated by reference in its entirety: U.S. patent application Ser. No. 13/084,399, filed on Apr. 11, 2011; U.S. patent application Ser. No. 13/953,616, filed Jul. 29, 2013; U.S. patent application Ser. No. 14/074,596, filed Nov. 7, 2013; and U.S. patent application Ser. No. 14/144,107, filed Dec. 30, 2013.

The processes described herein are used to produce various types of films including, but not limited to, silicon oxide, silicon nitride, silicon carbide, doped oxide, metal oxide, and metal nitride. Unless otherwise clear from context, the term silicon oxide is intended to cover stoichiometric and non-stoichiometric solid compositions of primarily silicon and oxygen. Silicon oxide films may have various morphologies, including varying degrees of crystallinity, roughness, etc. Similarly, the other film types mentioned herein may be stoichiometric or non-stoichiometric, and may have various morphologies.

ALD processes are often carried out in batches. A single batch may have anywhere from a few substrates to several hundred substrates. A single batch includes all substrates processed on a particular apparatus between subsequent cleaning cycles. FIG. 1 presents a flowchart detailing operations that occur during a single batch. At operation 101, a clean chamber may be provided at the beginning of a batch. Next, the chamber may be prepared for use in operations 103. In various cases the chamber preparation operation includes deposition of an undercoat and a precoat, which help stabilize the deposition process and minimize contamination on the substrates. Chamber cleaning and preparation are further discussed in the following U.S. patents and patent applications, each of which is herein incorporated by reference in its entirety: U.S. patent application Ser. No. 14/089,653, filed Nov. 25, 2013, and titled "CHAMBER UNDERCOAT PREPARATION METHOD FOR LOW TEMPERATURE ALD FILMS"; U.S. patent application Ser. No. 14/158,536, filed Jan. 17, 2014, and titled "METHOD AND APPARATUS FOR THE REDUCTION OF DEFECTIVITY IN VAPOR DEPOSITED FILMS"; U.S. patent application Ser. No. 12/355,601, filed Jan. 16, 2009, and titled "PLASMA CLEAN METHOD FOR DEPOSITION CHAMBER"; U.S. patent application Ser. No. 13/654,303, filed Oct. 17, 2012, and titled "METHODS AND APPARATUS FOR CLEANING DEPOSITION CHAMBERS"; U.S. Pat. No. 7,479,191; and U.S. Pat. No. 8,262,800.

After the chamber is prepared, substrates may be processed through the apparatus during operation 105. This step involves depositing film on the various substrates in the batch. Where the apparatus includes multiple stations, multiple substrates may be processed simultaneously. As material is deposited on the substrates, material from the deposition processes builds up on the interior chamber surfaces. After all the substrates in the batch have been processed, the chamber is cleaned to remove the accumulated material in operation 107. The cleaning process in operation 107 ends the batch. Chamber cleaning methods are further discussed in the following U.S. patents and patent applications, each of which is incorporated herein in its entirety: U.S. Pat. No. 7,479,191; U.S. Pat. No. 8,262,800; U.S. patent application Ser. No. 12/355,601, filed Jan. 16, 2009, and titled "PLASMA CLEAN METHOD FOR DEPOSITION CHAMBER"; and U.S. patent application Ser. No. 13/654,303, filed Oct. 17, 2012, and titled "METHODS AND APPARATUS FOR CLEANING DEPOSITION CHAMBERS."

After the reaction chamber is cleaned, a new batch of substrates may be processed, indicated by the dashed arrow in FIG. 1. Before film is actually deposited on the substrates in the next batch, the chamber is again prepared for deposition, for example through deposition of a new undercoat and precoat on interior chamber surfaces. A batch may also be considered to start and end at different points, so long as the basic deposition, chamber clean, and chamber preparation steps take place. For instance, a batch may be considered to start once the chamber is already prepared, when deposition on the first substrate in the batch first occurs. In this case, the batch would be considered finished after the chamber is cleaned and prepped for the next batch.

Unfortunately, certain properties of the deposited film tend to drift over time within a batch. Examples of properties that may drift include film thickness and etching rates, among others. These trending film properties are especially problematic in certain applications such as double patterning spacers, FinFET spacers, and gate liners and spacers. These applications may require precise critical dimension control, which requires accurate control of film properties such as film thickness, refractive index, etching rates, etc.

Large batch sizes are advantageous in terms of maximizing throughput, since less time is lost cleaning and preparing the chamber between batches. In some cases, a batch includes at least about 50 substrates, for example at least about 100 substrates, or at least about 200 substrates, or at least about 300 substrates, or at least about 400 substrates, or at least about 500 substrates. One factor that allows the use of large batch sizes is a large chamber volume. In some cases the chamber volume may be at least about 2 L, for example at least about 0.5 L. Example apparatus that may be adapted for use with the present embodiments include the VECTOR®, SPEED®, and ALTUS® product family of apparatus, available from Lam Research Corporation of Fremont, Calif. Large chamber volumes may permit multiple substrates to be processed at once, for example at different stations within the chamber volume. Further, large chamber volumes result in a slower buildup of accumulated material on the chamber surfaces, since there is a greater surface area on which such accumulation occurs. However, large batch sizes also contribute to the film property trending problem. For instance, larger batches may result in greater shifts in the film properties within a batch.

It is believed that the film property trending issue stems at least in part from the accumulation of material on the interior chamber surfaces. As the deposited material accumulates, the chamber impedance changes. Accumulation on the chamber walls and on the backside of the showerhead can be especially problematic in terms of a varying chamber impedance. This change in chamber impedance affects the efficiency at which RF power is delivered to the substrate. Thus, while conventional methods generally employ a single RF power setting for an entire batch of substrates, the actual amount of RF power delivered to the substrate changes over the course of a batch. In various cases, the efficiency at which the RF power is delivered to the substrate increases over the course of a batch. With regard to film thickness, for instance, this increased RF delivery efficiency results in decreasing film thickness as additional substrates in the batch are processed.

Figure 2:
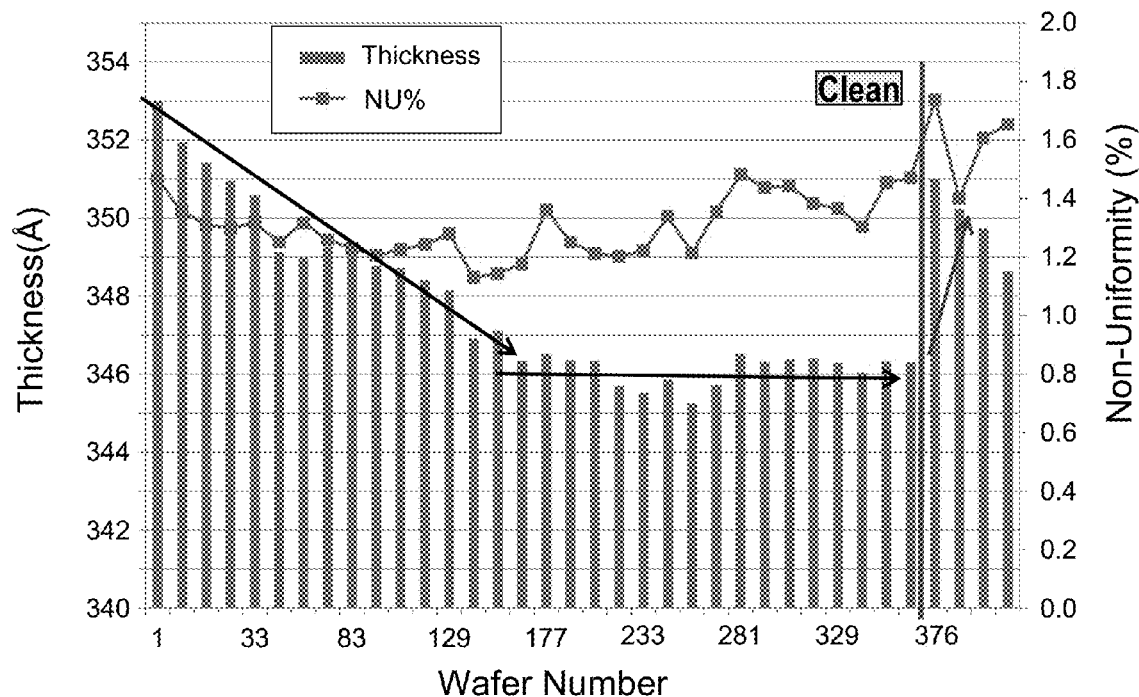
FIG. 2 presents a graph showing the film thickness and thickness non-uniformity for various substrates over the course of a batch.

FIG. 2 presents data related to a 375 substrate batch where silicon oxide was deposited on each substrate. The beginning portion of a second batch is also shown starting at substrate number 376. The average film thickness and within-wafer thickness non-uniformity for various individual substrates in the batch are shown in the figure. The film thickness trends downward over the first 150 or so substrates. The film thickness is much more stable for the remaining substrates in the batch. The film thickness spikes upward again at the beginning of the next batch (after the chamber is cleaned). Overall the film thickness ranges about 7.8 Å between the thinnest and thickest films of the batch, representing about 2.25% of the film thickness. The within-wafer thickness non-uniformity is fairly stable over the course of the batch. Though the data in FIG. 2 relate to a batch where silicon oxide was deposited, other film types experience the same drift in thickness over time during a batch.

As mentioned, it is believed that the film thickness trends downwards due to increasing efficiency of RF power delivery to the substrate over time, which may result from the increasing accumulation on the interior surfaces of the reaction chamber (e.g., chamber walls, ceiling, showerhead, etc.). Such accumulation affects the chamber impedance, which can affect the deposition results. These effects are particularly pronounced when the film being deposited is a dielectric film.

In various embodiments herein, steps are taken to reduce the degree to which certain film properties trend over a batch of substrates. For instance, RF power can be changed over time to address the changing efficiency at which RF is delivered to the substrate. The methods disclosed herein provide techniques for controlling RF power in a way that achieves more stable film properties over a batch of substrates.

Figure 3:
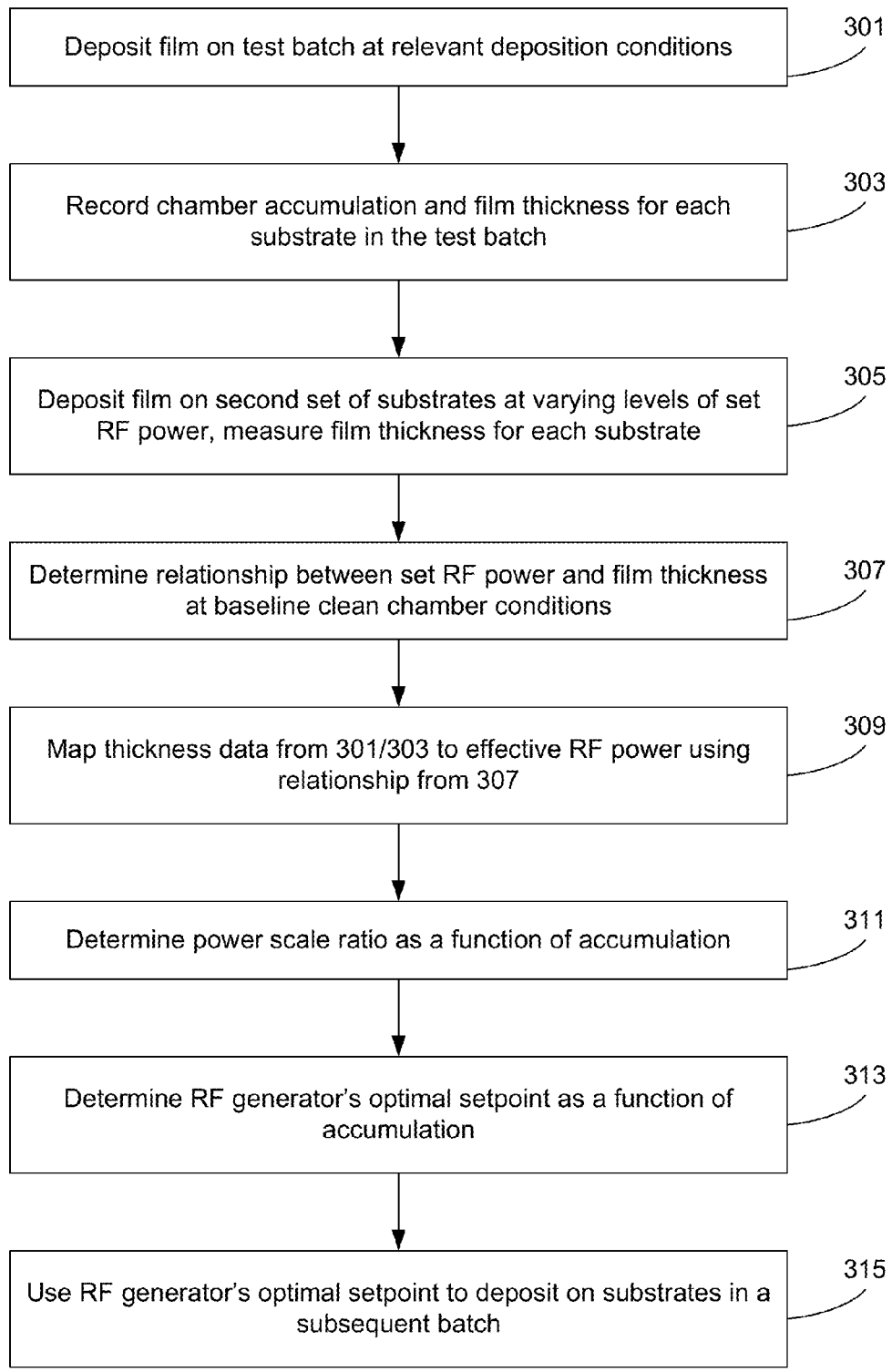
FIG. 3 shows a flow chart for a method of calibrating a deposition apparatus for depositing film on substrates using RF compensation.

FIG. 3 presents a flowchart for a method of controlling RF power over a batch of substrates. The method involves certain experimental/calibration steps, which may be performed as needed. It is not necessary to perform these steps each and every time a batch is run. In some implementations, the experimental/calibration steps are run once (e.g., once per set of relevant deposition conditions such as particular film types, precursors, flow rates, timing, temperature, pressure, etc.), and the results are used to control RF power over many batches (e.g., any batches using the relevant deposition conditions). In some cases the deposition parameters are uniform between those used for the experimental/calibration procedures and those used to deposit film on substrates generally. In other cases certain deposition parameters (e.g., flow rates, timing, temperature, pressure, RF power, etc.) may change by about 10% or less, for example 5% or less, between those used for the calibration procedures and those used to deposit on substrates generally. The operations listed in FIG. 3 are explained in relation to the graphs shown in FIGS. 4-8.

The method 300 of FIG. 3 begins at operation 301, where a test batch is run using the relevant deposition conditions that are to be used for depositing film on substrates. The test batch should be relatively large such that any trending over the batch is apparent and well characterized. The test batch may include at least about as many substrates as are processed in a desired batch process. In some cases, the test batch includes at least about 100 substrates, at least about 200 substrates, at least about 300 substrates, at least about 400 substrates, or at least about 500 substrates. In the example shown with regard to FIGS. 4-8, the test batch includes about 375 substrates, and the RF generator is set to deliver 1600 W. The batch should be run in a clean chamber after the chamber is prepared for deposition as described with relation to FIG. 1 (e.g., after deposition of an undercoat/precoat). During operation 301, substrates are fed into a deposition apparatus and film is deposited on the substrates.

Figure 4:
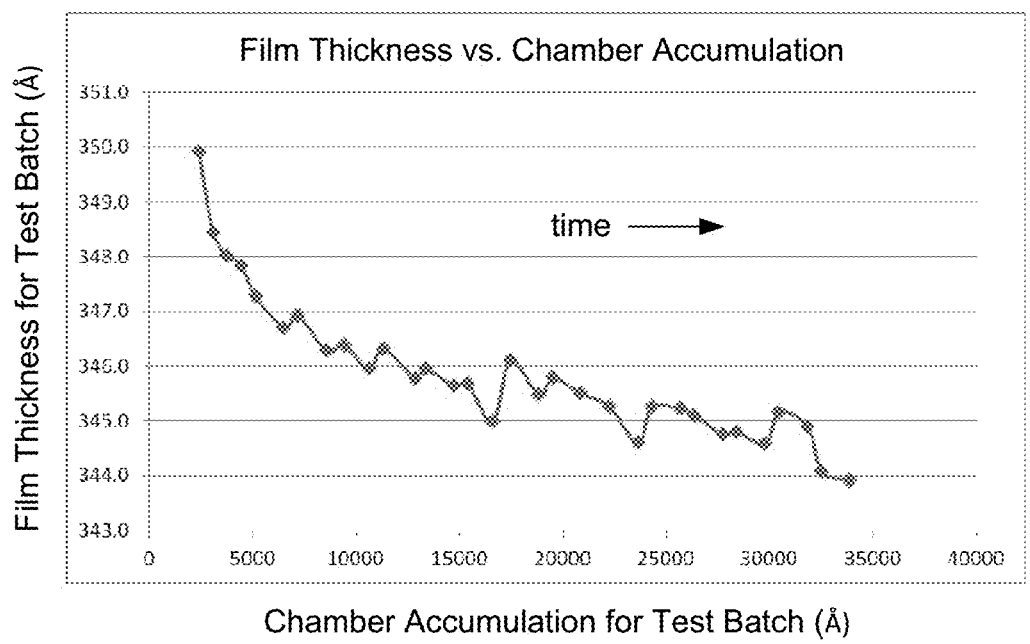
FIG. 4 depicts a graph showing film thickness vs. chamber accumulation for a test batch of substrates.

During deposition, the amount of chamber accumulation is monitored/recorded as each substrate is processed. Chamber accumulation increases as more and more substrates are processed. Chamber accumulation typically relates to a metric that is calculated based on the deposition conditions, rather than relating to an actual measured quantity. Nonetheless, chamber accumulation can be reliably calculated and monitored over the batch, as shown in operation 303. After deposition, each substrate is tested for film thickness, also shown in operation 303. Thus, the chamber accumulation and film thickness are known for each substrate in the batch. A relationship between film thickness and chamber accumulation can then be characterized based on this data, for example by plotting film thickness vs. chamber accumulation, as shown in FIG. 4. Similar to the trend shown in FIG. 2, the film thickness trends downward over the course of the batch.

Next, film is deposited and measured on a second set of substrates at varying levels of set RF power in operation 305. Set RF power refers to the amount of RF power set by a power supply. For instance, if an RF generator is set/programmed to deliver 1600 W, the set RF power is 1600 W. The set RF power differs from the effective RF power, which is discussed further below. Deposition on the second set of substrates should occur in a chamber that is relatively clean. For instance, the second set of substrates may be run in a chamber that has just been prepared with a new undercoat/precoat. In various embodiments, the second set of substrates is started when fewer than 25 substrates (e.g., fewer than 25 substrates, fewer than 15 substrates, fewer than 10 substrates, fewer than 5 substrates, fewer than 3 substrates, or zero substrates) have been processed in the chamber since deposition of the undercoat/pre-coat. Cleaner chambers help provide more accurate/useful results for this step. A clean chamber having been prepared for deposition can be said to represent a "baseline" condition. The second set of substrates may be much smaller than the test batch of substrates. In some cases, the second set of substrates has at least about 15 substrates, for example at least about 25 substrates. In these or other cases, the second set of substrates may have about 25 substrates or fewer. The film thickness for each substrate is measured and recorded.

Figure 5:
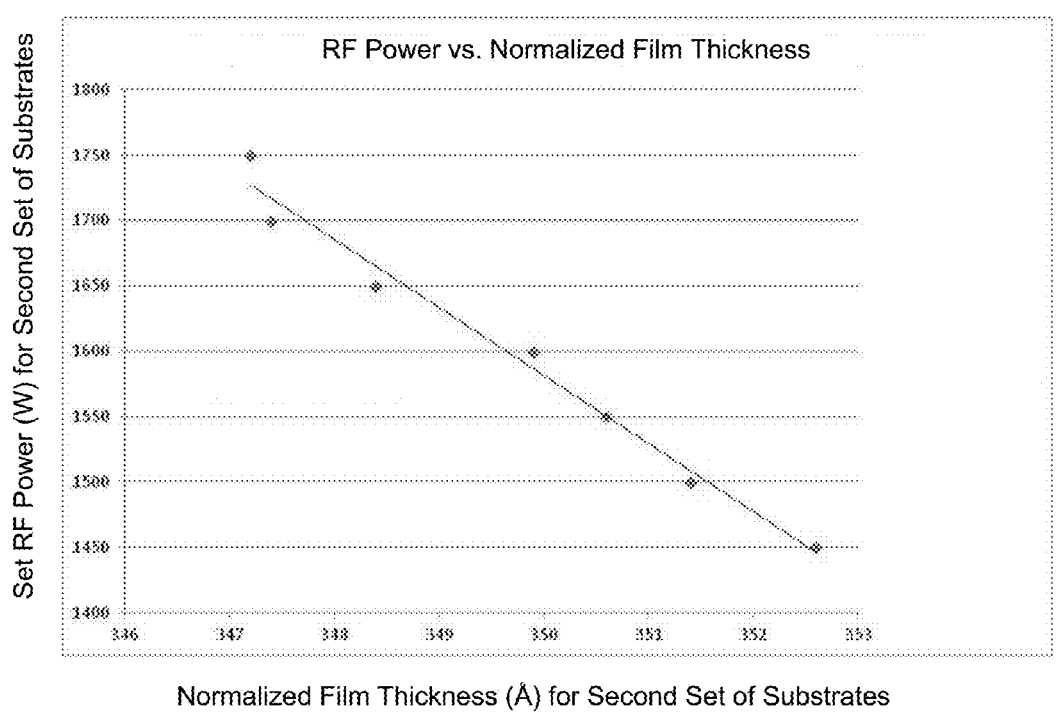
FIG. 5 depicts a table and graph showing RF power and film thickness, useful in various embodiments where RF compensation is used.

The set RF power changes over the course of the second set of substrates. At least one substrate should be run at a set RF power that is the same as the set RF power used to deposit film on the test batch. The other substrates may be run at set RF power values above and/or below the set RF power used in the test batch. By running at least one substrate at the set RF power used on the test batch, the data generated in this operation can be normalized to the data from operations 301/303. Normalization involves determining a difference between (a) the film thickness on the first substrate in the test batch and (b) the film thickness on the substrate in the second set that was run at the set RF power of the test batch. In the context of FIGS. 4 and 5, this means comparing the film thickness (349.9 Å) of the first substrate in FIG. 4 to the film thickness (346.8 Å) in the table of FIG. 5 for the substrate run at 1600 W (the set RF power used when running the test batch of FIG. 4). This difference (349.9 Å−346.8 Å=3.1 Å) represents the amount by which all of the data in the second set should be shifted to normalize the data. The raw thickness data as well as the normalized thickness data are presented in the table of FIG. 5. The graph shown in FIG. 5 shows only the normalized thicknesses. A relationship between set RF power levels and film thickness can then be derived in operation 307, for instance by plotting set RF power vs. film thickness, as shown in FIG. 5. Regression analysis can be performed to determine a fit (e.g., a linear curve in FIG. 5, though other types of fit may be used as appropriate) between the variables.

Figure 6:
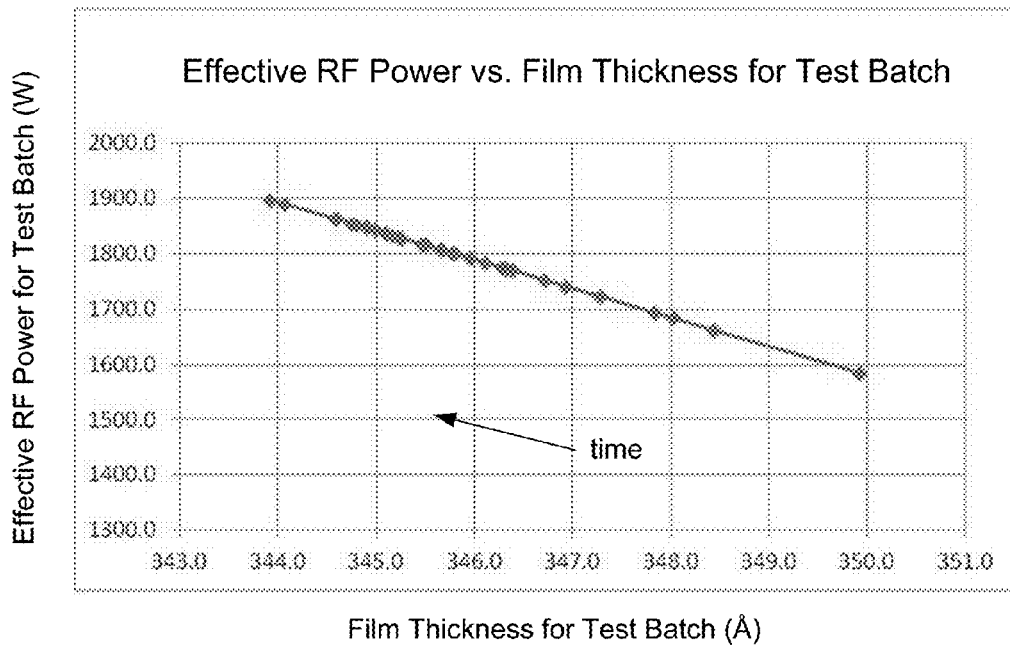
FIG. 6 presents a graph showing effective RF power vs. film thickness for a test batch of substrates.

Next in operation 309, the relationship determined in operation 307 is used to map the thickness data generated in operations 301/303 to an effective RF power. The term "effective RF power" relates generally to the set RF power as modified by the efficiency at which the RF power is delivered to a substrate. The effective RF power directly correlates with the amount of RF power that is actually delivered to a substrate. More specifically, the effective RF power is the level at which an RF generator would need to be set to achieve the actual film thickness achieved if baseline conditions (e.g., clean chamber with little to no accumulation) were present. The result is shown in FIG. 6. In FIG. 6, the beginning of the batch is shown toward the right of the graph and the end of the batch is shown toward the left of the graph. The arrow marked time is provided for ease of understanding, though it is understood that time is not directly shown in the figure. At the beginning of the batch (where film thickness is about 350 Å), the effective RF power closely matches the set RF power (1600 W), since the baseline conditions (clean chamber) were present at the beginning of the batch. As more substrates are processed, the effective RF power increases, departing rather significantly from the set RF power.

Figure 7:
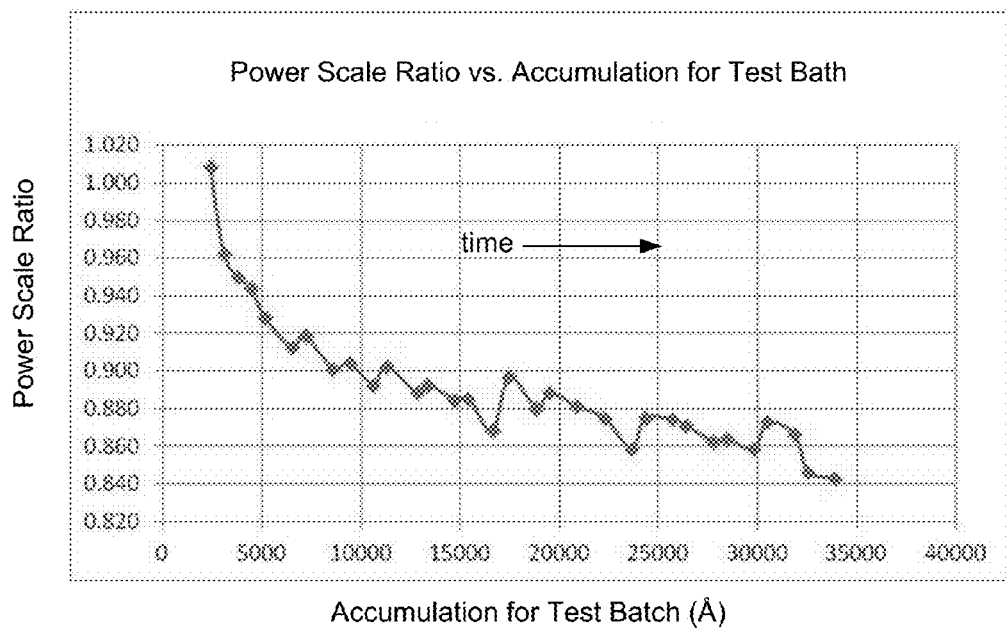
FIG. 7 presents a graph showing a power scale ratio vs. accumulation for a test batch, useful in various embodiments where RF compensation is used.

Next, at operation 311, a power scaling ratio is determined as a function of accumulation for data related to the test batch. The power scaling ratio is determined for each individual substrate, and is calculated as the set RF power used in the test batch (1600 W in this example) divided by the effective RF power delivered to the substrate as determined in operation 309 and shown in FIG. 6. Accumulation is known from previous operations and was presented in FIG. 4. The data can be combined to show a relationship between the power scale ratio and accumulation, as shown in FIG. 7. In certain embodiments, it may be desirable to omit the first substrate in the batch when determining the power scaling ratio.

Figure 8:
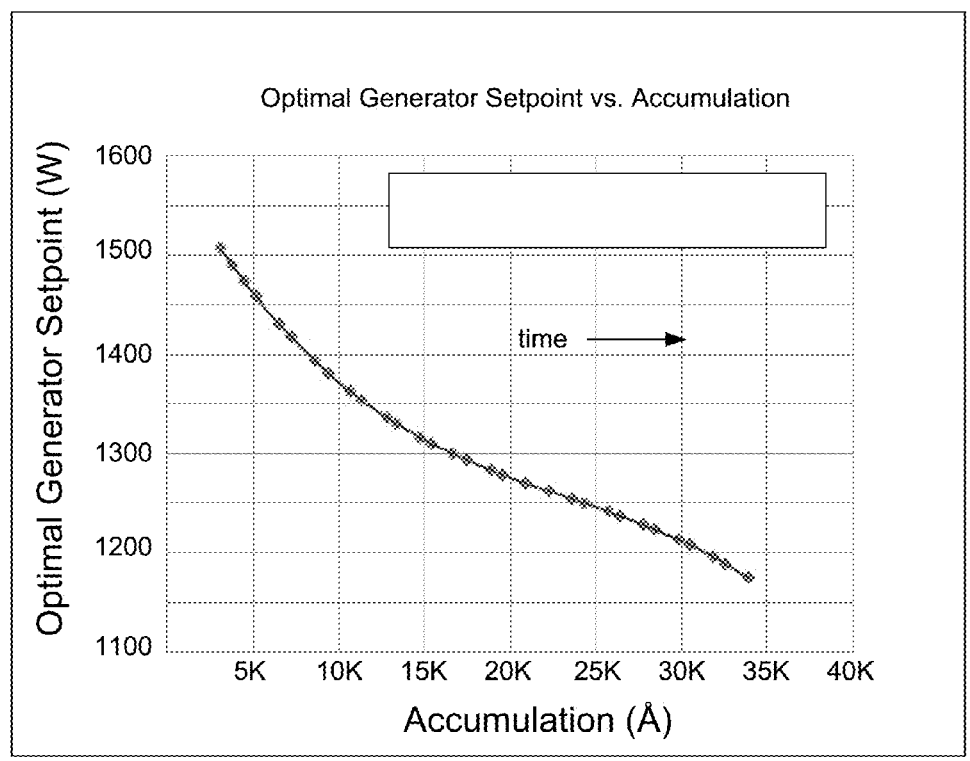
FIG. 8 presents a graph showing an optimal generator setpoint vs. accumulation according to one embodiment.

Then, at operation 313, the RF generator's optimal setpoint is determined (for future batches) as a function of accumulation based on the power scaling ratio function determined in operation 311 and shown in FIG. 7. The generator's setpoint relates to the set RF power delivered by the generator. The optimal generator setpoint for each substrate data point is calculated as the set RF power used in the test batch (1600 W in this example) multiplied by the power scaling ratio for each substrate. The result is shown in FIG. 8. Regression analysis may be used to determine a mathematical relationship between the optimal setpoint and the level of accumulation. In some examples, such as the one shown in FIG. 8, the data is fit to a third degree polynomial curve. Other types of curve fitting may be used as appropriate. The coefficients of the fitted curve can then be fed to a controller that controls the RF generator's setpoint (i.e., the set RF power). In operation 315, the controller may use such coefficients to cause the RF generator to deliver the desired amount of set RF power based on the optimal setpoints determined in operation 313 to deposit film on a new batch of substrates. As the new batch of substrates is processed, chamber accumulation continually builds up on the chamber surfaces, and the generator setpoint is continually changed to deliver the optimal amount of RF based on the amount of accumulation present at that particular time in the batch. For instance, based on the data shown in FIG. 8, the RF generator may deliver a set RF power of about 1320 W when about 15,000 Å of accumulation is present, and only about 1245 W when about 25,000 Å of accumulation is present. The first substrate (or the first couple of substrates) in the test batch may be omitted when determining the optimal generator setpoint of future batches, and the first substrate (or the first couple of substrates) in future batches may be deposited at, for instance, the set RF power used during the test batch. This may result in a substantial drop in set RF power over the course of the first few substrates in future batches.

As noted above, the efficiency at which the RF power is delivered to the substrate surface generally increases over time during a batch. To combat this increasing efficiency and deliver RF to the substrate surface at a more stable level, the set RF power (i.e., the power at which an RF generator is set) can be decreased over time during the course of a batch, as shown in FIG. 8. The disclosed RF compensation methods provide guidance for reducing the set RF over time in an intelligent manner that achieves more uniform film properties. One result is that the film thickness is more stable over time during a batch. A related result is that the wet etch rate of the films is more stable over time during a batch. These results are presented below in the Experimental section.

In a related RF compensation method, accumulation is not directly considered. Instead, the substrate number is used (e.g., the first substrate in a batch is substrate #1, the second is substrate #2, and so forth). Because accumulation correlates directly with substrate number, the RF compensation method may be carried out without considering accumulation. The use of accumulation, rather than substrate number, may be better in cases where the deposition conditions (excluding set RF power) change over the course of a batch. In such cases, the relation between accumulation and substrate number is less reliable.

In another related RF compensation method, no modeling is used to characterize the optimal generator setpoint vs. accumulation. Instead, the optimal generator setpoint is determined simply by following the data shown in FIG. 8. The generator setpoint can be set at desired levels for particular accumulation levels without ever modeling a mathematical relationship between the variables. While a mathematical model may simplify control of the set RF power, such a model is not needed to practice the disclosed embodiments.

Certain deposition conditions should remain constant between the test batch, the second set of substrates, and a subsequent batch run in RF compensation mode based on the test batch. These deposition conditions include temperature, RF frequency, gas flow, dose flow, pressure, dose time, purge times, RF time. Other deposition conditions may be changed between the test batch and a batch run in RF compensation mode. These conditions may include cycle number.

Apparatus

The methods described herein may be performed by any suitable apparatus. A suitable apparatus includes hardware for accomplishing the process operations and a system controller having instructions for controlling process operations in accordance with the present invention. In some embodiments, the hardware may include one or more process stations included in a process tool.

Figure 9:
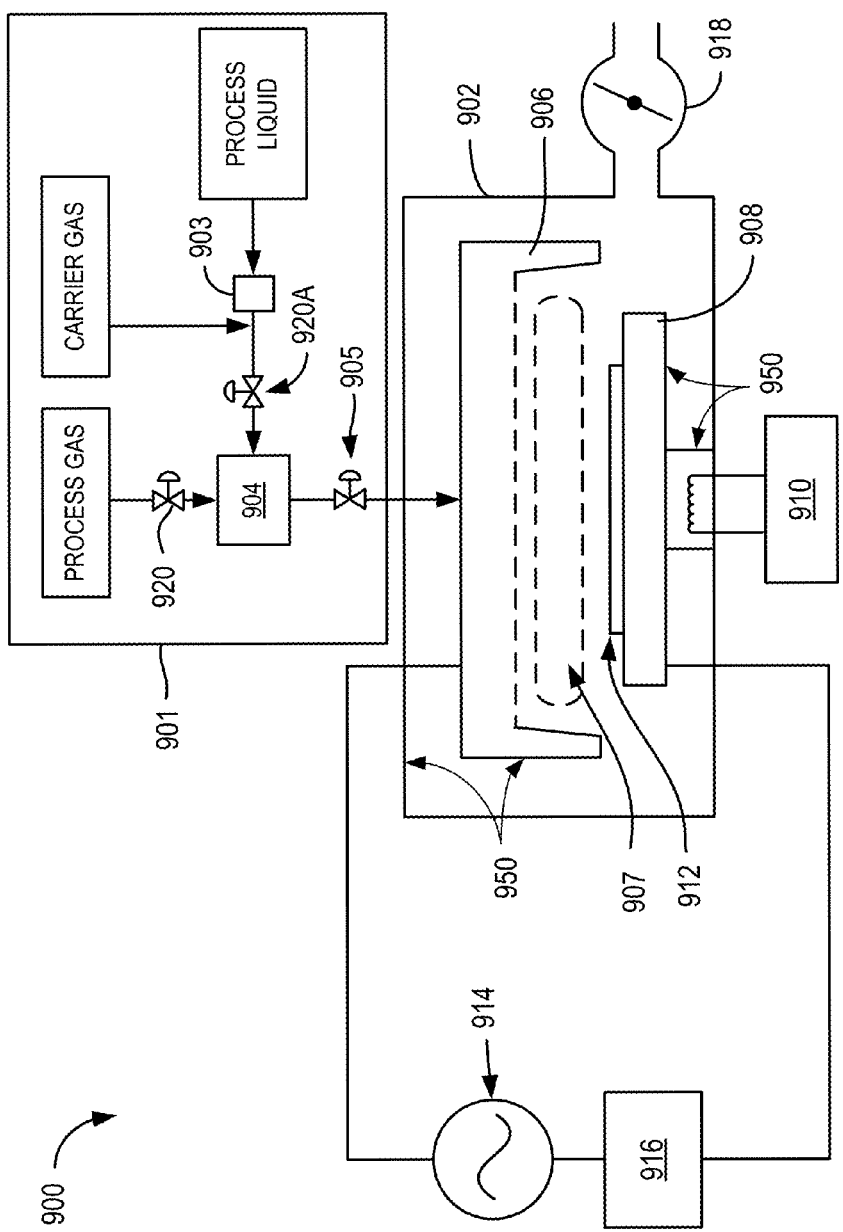
FIGS. 9 and 10 present views of a reaction chamber that may be used to deposit film on substrates in certain implementations.
Figure 11:
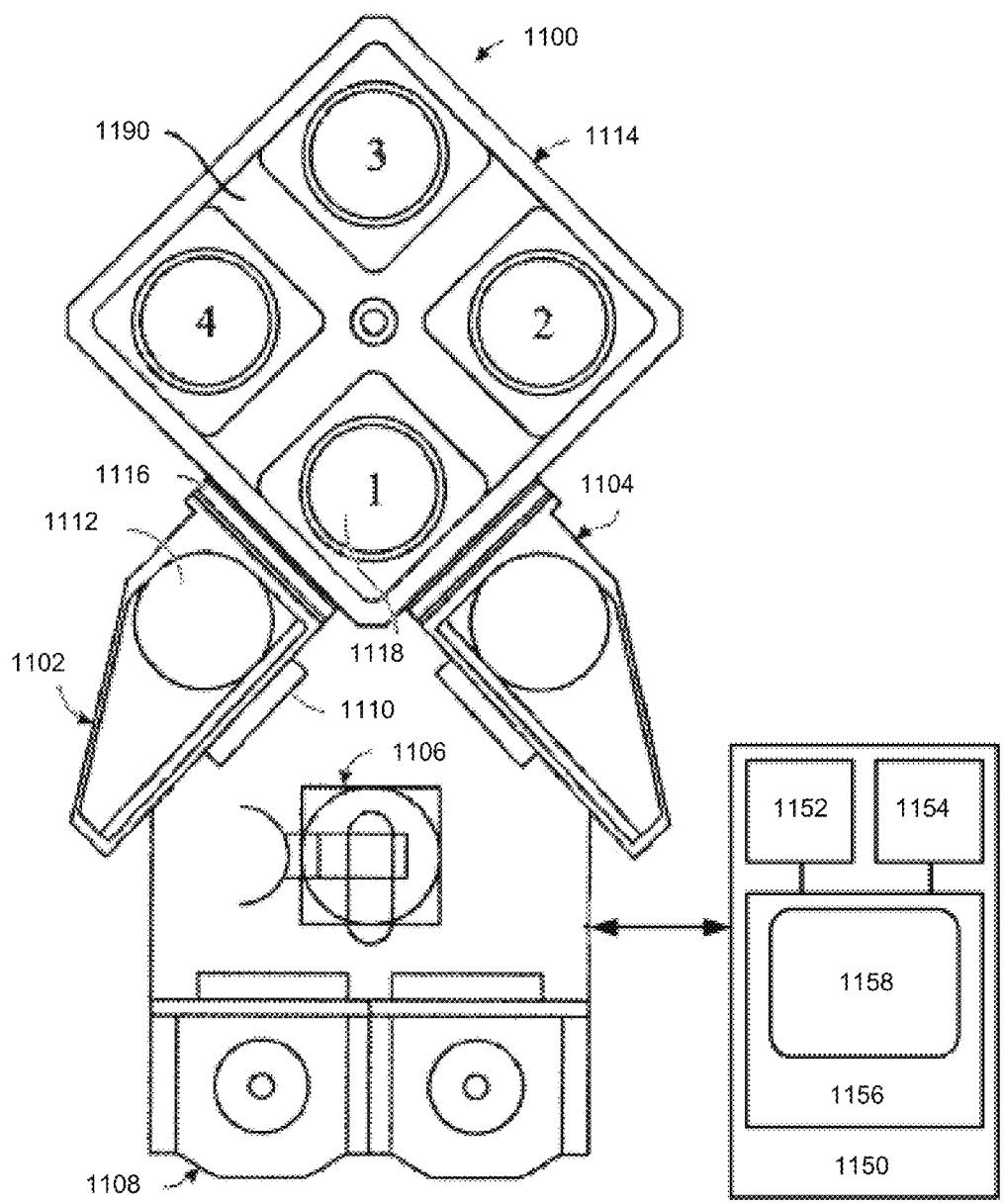
FIG. 11 illustrates a multi-station reaction chamber that may be used in certain embodiments.

FIG. 9 schematically shows an embodiment of an ALD process station 900. For simplicity, process station 900 is depicted as a standalone process station having a process chamber body 902 for maintaining a low-pressure environment. However, it will be appreciated that a plurality of process stations 900 may be included in a common process tool environment. For example, FIG. 11 depicts an embodiment of a multi-station processing tool 1100. Further, it will be appreciated that, in some embodiments, one or more hardware parameters of process station 900, including those discussed in detail above, may be adjusted programmatically by one or more computer controllers.

ALD process station 900 fluidly communicates with reactant delivery system 901 for delivering process gases to a distribution showerhead 906. Reactant delivery system 901 includes a mixing vessel 904 for blending and/or conditioning process gases for delivery to showerhead 906. One or more mixing vessel inlet valves 920 may control introduction of process gases to mixing vessel 904.

Some reactants, like BTBAS, may be stored in liquid form prior to vaporization at and subsequent delivery to the process station. For example, the embodiment of FIG. 9 includes a vaporization point 903 for vaporizing liquid reactant to be supplied to mixing vessel 904. In some embodiments, vaporization point 903 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 903 may be heat traced. In some examples, mixing vessel 904 may also be heat traced. In one non-limiting example, piping downstream of vaporization point 903 has an increasing temperature profile extending from approximately 100 degrees Celsius to approximately 150 degrees Celsius at mixing vessel 904.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 904. In another scenario, a liquid injector may be mounted directly to showerhead 906.

In some embodiments, a liquid flow controller upstream of vaporization point 903 may be provided for controlling a mass flow of liquid for vaporization and delivery to process station 900. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 906 distributes process gases toward substrate 912. In the embodiment shown in FIG. 9, substrate 912 is located beneath showerhead 906, and is shown resting on a pedestal 908. It will be appreciated that showerhead 906 may have any suitable shape, and may have any suitable number and arrangement of ports for distributing processes gases to substrate 912. In certain embodiments, the showerhead is configured to deliver two or more gases at different temperatures. Examples of such showerheads are further discussed in U.S. patent application Ser. No. 13/934,597, filed Jul. 3, 2013, and titled "MULTI-PLENUM, DUAL-TEMPERATURE SHOWERHEAD," which is herein incorporated by reference in its entirety.

In some embodiments, a microvolume 907 is located beneath showerhead 906. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 908 may be raised or lowered to expose substrate 912 to microvolume 907 and/or to vary a volume of microvolume 907. For example, in a substrate transfer phase, pedestal 908 may be lowered to allow substrate 912 to be loaded onto pedestal 908. During an ALD process phase, pedestal 908 may be raised to position substrate 912 within microvolume 907. In some embodiments, microvolume 907 may completely enclose substrate 912 as well as a portion of pedestal 908 to create a region of high flow impedance during an ALD process.

Optionally, pedestal 908 may be lowered and/or raised during portions the ALD process to modulate process pressure, reactant concentration, etc., within microvolume 907. In one scenario where process chamber body 902 remains at a base pressure during the process, lowering pedestal 908 may allow microvolume 907 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 908 may allow a plasma density to be varied during plasma activation and/or treatment cycles included in the ALD process. At the conclusion of the ALD process phase, pedestal 908 may be lowered during another substrate transfer phase to allow removal of substrate 912 from pedestal 908.

While the example microvolume variations described herein refer to a height-adjustable pedestal, it will be appreciated that, in some embodiments, a position of showerhead 906 may be adjusted relative to pedestal 908 to vary a volume of microvolume 907. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers.

Returning to the embodiment shown in FIG. 9, showerhead 906 and pedestal 908 electrically communicate with RF power supply 914 and matching network 916 for powering a plasma. Methods and apparatus for applying RF over multiple stations are further discussed in U.S. patent application Ser. No. 14/458,135, filed Aug. 12, 2014, and titled "MULTI-STATION PLASMA REACTOR WITH RF BALANCING," which is herein incorporated by reference in its entirety. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are included above. Likewise, RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 908 may be temperature controlled via heater 910. Further, in some embodiments, pressure control for process station 900 may be provided by butterfly valve 918. As shown in the embodiment of FIG. 9, butterfly valve 918 throttles a vacuum provided by a downstream vacuum pump (not shown). However, in some embodiments, pressure control of process station 900 may also be adjusted by varying a flow rate of one or more gases introduced to process station 900.

The internal surfaces of the process station 900 are coated with undercoat 950. Examples of surfaces that become coated with undercoat include the chamber walls 902, the chamber ceiling and floor, the pedestal 908 and the showerhead 906. Although FIG. 9 is shown with a substrate 912 in the process station 900, this substrate 912 is not present during deposition of an undercoat. Instead, the substrate 912 is introduced to the process station 900 after the undercoat is deposited, when the process station 900 is ready to be used for depositing film on the substrate 912.

Figure 10:
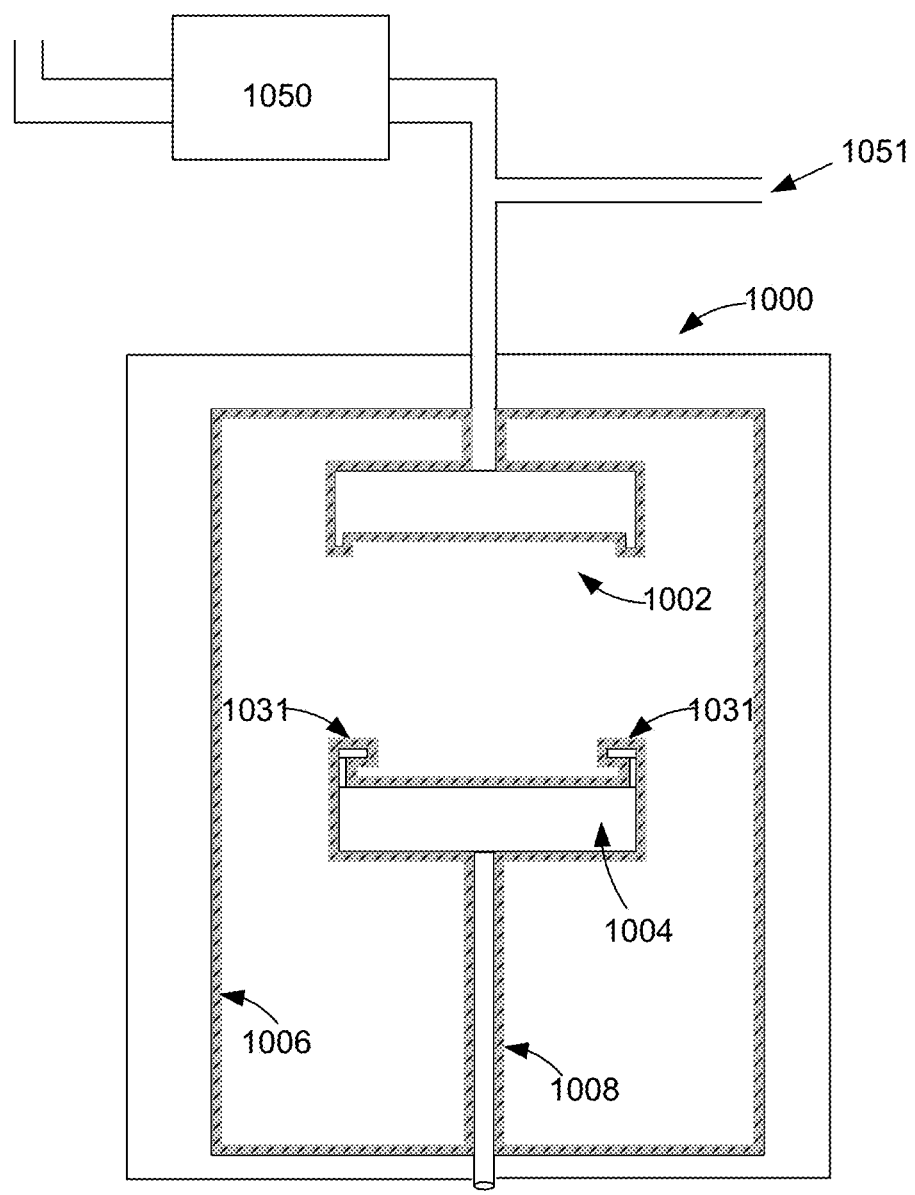

FIG. 10 shows another view of a reaction chamber 1000. When used to deposit films on substrates, the substrate (not shown) is positioned on the substrate carrier ring 1031, which is supported by pedestal 1004 (also referred to as a substrate support), which is supported by support pillar 1008. Process gases are provided to the reaction chamber through inlet 1051. In this embodiment, a remote plasma generator 1050 may be used to generate plasma. After passing through inlet 1051, reactants and other process gases enter the reaction chamber through showerhead 1002. The interior surfaces of the reaction chamber (including at least the showerhead 1002, support 1008, pedestal 1004, substrate carrier ring 1031, and the walls, floor and ceiling of the reaction chamber 1000) are coated with undercoat 1006. The thickness of undercoat 1006 has been exaggerated for the purpose of illustration.

As described above, one or more process stations may be included in a multi-station processing tool. FIG. 11 shows a schematic view of an embodiment of a multi-station processing tool 1100 with an inbound load lock 1102 and an outbound load lock 1104, either or both of which may comprise a remote plasma source. A robot 1106, at atmospheric pressure, is configured to move wafers from a cassette loaded through a pod 1108 into inbound load lock 1102 via an atmospheric port 1110. A wafer is placed by the robot 1106 on a pedestal 1112 in the inbound load lock 1102, the atmospheric port 1110 is closed, and the load lock is pumped down. Where the inbound load lock 1102 comprises a remote plasma source, the wafer may be exposed to a remote plasma treatment in the load lock prior to being introduced into a processing chamber 1114. Further, the wafer also may be heated in the inbound load lock 1102 as well, for example, to remove moisture and adsorbed gases. Next, a chamber transport port 1116 to processing chamber 1114 is opened, and another robot (not shown) places the wafer into the reactor on a pedestal of a first station shown in the reactor for processing. While the embodiment depicted in FIG. 11 includes load locks, it will be appreciated that, in some embodiments, direct entry of a wafer into a process station may be provided.

The depicted processing chamber 1114 comprises four process stations, numbered from 1 to 4 in the embodiment shown in FIG. 11. Each station has a heated pedestal (shown at 1118 for station 1), and gas line inlets. In some cases the gas lines are shared between the various stations. It will be appreciated that in some embodiments, each process station may have different or multiple purposes. For example, in some embodiments, a process station may be switchable between an ALD mode, a CFD mode, and a CVD process mode. Additionally or alternatively, in some embodiments, processing chamber 1114 may include one or more matched pairs of ALD/CFD/CVD process stations. While the depicted processing chamber 1114 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 11 also depicts an embodiment of a wafer handling system 1190 for transferring wafers within processing chamber 1114. In some embodiments, wafer handling system 1190 may transfer wafers between various process stations and/or between a process station and a load lock. It will be appreciated that any suitable wafer handling system may be employed. Non-limiting examples include wafer carousels and wafer handling robots.

System Controller

FIG. 11 also depicts an embodiment of a system controller 1150 employed to control process conditions and hardware states of process tool 1100. System controller 1150 may include one or more memory devices 1156, one or more mass storage devices 1154, and one or more processors 1152. Processor 1152 may include a CPU or computer, analog and/or digital input/output connections, stepper motor controller boards, etc.

In some embodiments, system controller 1150 controls all of the activities of process tool 1100. System controller 1150 executes system control software 1158 stored in mass storage device 1154, loaded into memory device 1156, and executed on processor 1152. System control software 1158 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 1100. These programmed processes may include various types of processes including, but not limited to, processes related to deposition of an undercoat, processes related to deposition of film on substrates, and processes related to cleaning the chamber. System control software 1158 may be configured in any suitable way. For example, various process tool component subroutines or control objects may be written to control operation of the process tool components necessary to carry out various process tool processes. System control software 1158 may be coded in any suitable computer readable programming language.

In some embodiments, system control software 1158 may include input/output control (IOC) sequencing instructions for controlling the various parameters described above. For example, each phase of an ALD undercoat deposition process may include one or more instructions for execution by system controller 1150. The instructions for setting process conditions for an ALD/CFD undercoat deposition process phase may be included in a corresponding ALD/CFD undercoat deposition recipe phase. In some embodiments, the recipe phases may be sequentially arranged, so that all instructions for a process phase are executed concurrently with that process phase.

Other computer software and/or programs stored on mass storage device 1154 and/or memory device 1156 associated with system controller 1150 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1118 and to control the spacing between the substrate and other parts of process tool 1100. The positioning program may include instructions for appropriately moving substrates in and out of the reaction chamber as necessary to form an undercoat, deposit films on substrates, and clean the chamber. These may include instructions for ensuring that no substrates are present in the reaction chamber during deposition of the ALD/CFD-based undercoat and during the cleaning process.

A process gas control program may include code for controlling gas composition and flow rates and optionally for flowing gas into one or more process stations prior to deposition in order to stabilize the pressure in the process station. In some embodiments, the process gas control program includes instructions for introducing certain gases during formation of an undercoat on the reaction chamber, and for introducing the same gases during formation of a film on a substrate in the reaction chamber. The process gas control program may also include instructions to deliver these gases at the same rates, for the same durations, during formation of the undercoat and during deposition of film on substrates.

A pressure control program may include code for controlling the pressure in the process station by regulating, for example, a throttle valve in the exhaust system of the process station, a gas flow into the process station, etc. The pressure control program may include instructions for maintaining the same pressure during deposition of the undercoat on the reaction chamber as during the deposition of film on substrates.

A heater control program may include code for controlling the current to a heating unit that is used to heat the substrate. Alternatively, the heater control program may control delivery of a heat transfer gas (such as helium) to the substrate. The heater control program may include code for maintaining the same temperature in the reaction chamber and/or substrate holder during deposition of the undercoat and during deposition of film on substrates.

A plasma control program may include code for setting RF power levels, frequencies, and exposure times in one or more process stations in accordance with the embodiments herein. In some embodiments, the plasma control program may include instructions for using the same RF power levels and/or frequencies and/or exposure times during deposition of the undercoat on the reaction chamber and during deposition of film on substrates.

In some embodiments, there may be a user interface associated with system controller 1150. The user interface may include a display screen, graphical software displays of the apparatus and/or process conditions, and user input devices such as pointing devices, keyboards, touch screens, microphones, etc.

In some embodiments, parameters adjusted by system controller 1150 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 1150 from various process tool sensors. The signals for controlling the process may be output on the analog and digital output connections of process tool 1100. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1150 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Figure 12:
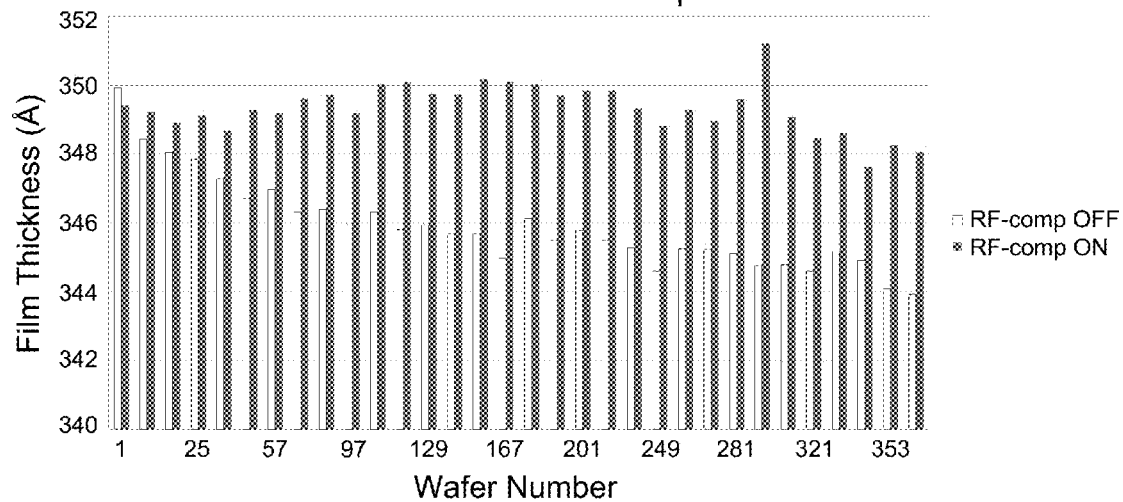
FIG. 12 presents a graph showing film thickness vs. wafer number for two batches of substrates: one batch being processed at a constant RF power and one batch being processed using RF compensation.

Experimental results have shown that the disclosed RF compensation methods can be used to control RF power over the course of a batch to achieve more uniform film properties over the course of the batch. Trending of film properties was particularly reduced in the context of film thickness and wet etch rate. FIG. 12 presents experimental results related to film thickness vs. wafer number for two 375 substrate batches. In one batch, the set RF power was constant over the entire batch. In the other batch, the disclosed RF compensation method was used and the set RF power was reduced over the course of the batch. Where a constant RF power is used (i.e., no RF compensation), the film thickness trends significantly downward over the course of the batch, for an overall thickness difference (maximum thickness minus minimum thickness) of about 6.0 Å. These results match those shown in FIG. 2. In contrast, where an RF compensation method is used, the film thickness is much more stable over the batch, with an overall thickness difference of just 2.1 Å. One outlier (between wafer numbers 281 and 321) having an above-expected thickness was excluded from this calculation, as the deposition system experienced an error at this time. The error was unrelated to the RF compensation, and the outlier is therefore irrelevant when comparing the batches. The results show that the disclosed RF compensation methods can be used to achieve much more stable film thickness over the course of a batch. In some embodiments, the overall thickness difference represents about 1% or less, for instance about 0.75% or less, of the average thickness deposited during the batch. In the example of FIG. 12, the thickness difference is about 0.6% of the average thickness where RF compensation is used, as compared to about 1.7% where no RF compensation is used. In such embodiments, the batch may include at least about 100, 200, 300, 400, or 500 substrates.

Figure 13:
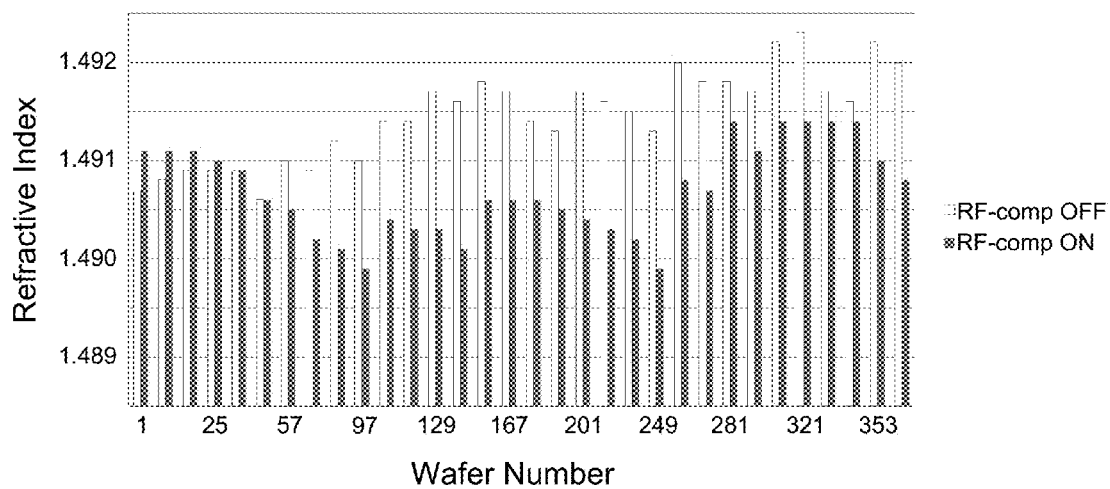
FIG. 13 presents a graph illustrating the refractive index vs. wafer number for the two batches of FIG. 12.

FIG. 13 presents experimental results related to refractive index vs. wafer number over the course of the two 375 wafer batches presented in FIG. 12. Different trending patterns are seen where the set RF power was constant vs. where the RF compensation method was used. The wafer-to-wafer non-uniformity in refractive index was essentially unchanged between the two batches. The overall difference in refractive index (maximum RI minus minimum RI) was slightly improved where the RF-compensation method was used (e.g., RI=0.0015 with RF compensation and 0.0017 without RF compensation). Refractive index is frequently considered to be one proxy for film quality. Thus, the results show that, at a minimum, that the disclosed RF compensation methods do not cause a decrease in film quality.

Figure 14:
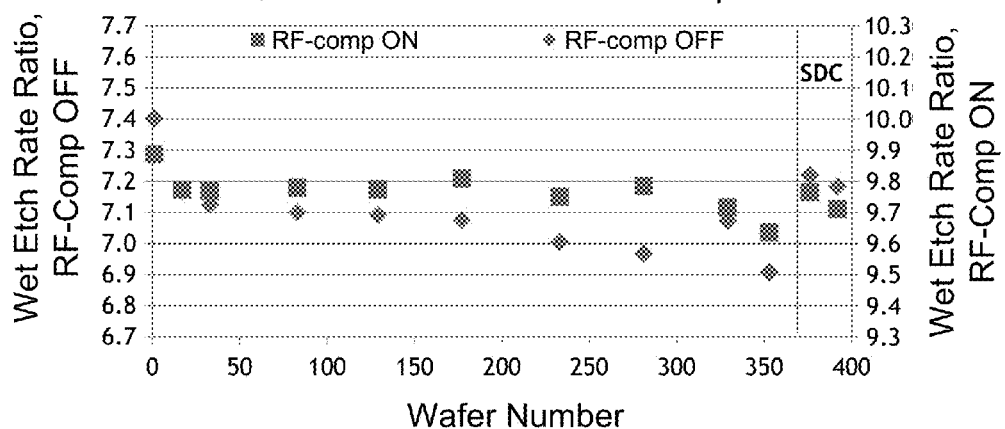
FIG. 14 illustrates a graph depicting the wet etch rate vs. wafer number for the two batches of FIG. 12.
Figure 16:
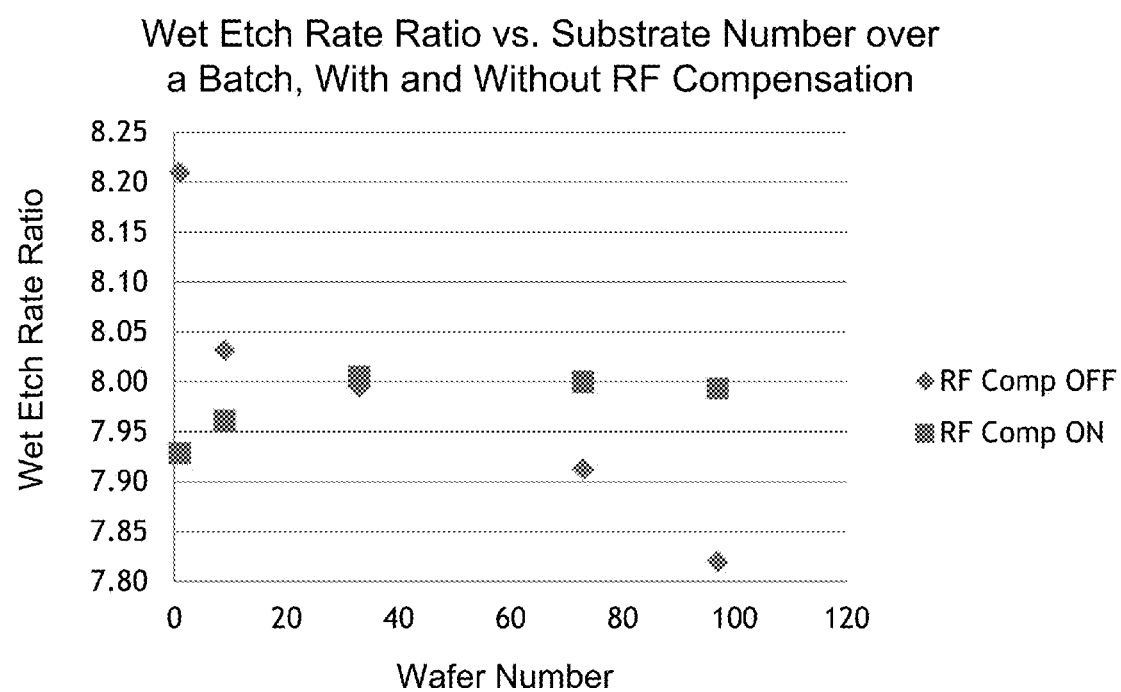
FIG. 16 presents a graph showing wet etch rate vs. wafer number for two batches: one deposited at constant RF and one deposited using RF compensation.

FIG. 14 presents experimental results related to wet etch rate ratio vs. wafer number for substrates in the two 375 substrate batches described with relation to FIGS. 12 and 13. FIG. 14 also presents data relating to the beginning portion of additional batches, starting at wafer number 376. The wet etch rate ratio (and dry etch rate ratio, below) refers to the wet etch rate of the relevant material compared to the wet etch rate of thermal oxide. The average wet etch rate ratio is expected to shift from batch to batch, and the two y-axes have different values to correspond to each batch. Where the set RF was constant and no RF compensation was used, the wet etch rate ratio trends downward over time, with an overall wet etch rate ratio difference (maximum WER ratio minus minimum WER ratio) of about 0.50. In contrast, where an RF compensation method is used, the wet etch rate ratio is much more stable over the batch, with an overall wet etch rate ratio difference of just 0.25. Thus, the spread in wet etch rate ratios was reduced by half where RF compensation was used. This reduction is a significant improvement. FIG. 16 presents additional results related to wet etch rate, and is discussed below. In certain embodiments, the overall wet etch rate ratio difference for the films in a batch is about 5% or less, 4% or less, or 3% or less of the average wet etch rate ratio in the batch. This may relate to an overall wet etch rate ratio difference that is less than about 0.4, or less than about 0.3. In the example of FIG. 14, the overall wet etch rate ratio is about 2.6% of the average wet etch rate ratio where RF compensation is used, compared to about 7% where no RF compensation is used. In these embodiments, the number of substrates in the batch may be at least about 100, 200, 300, 400, or 500.

Figure 15:
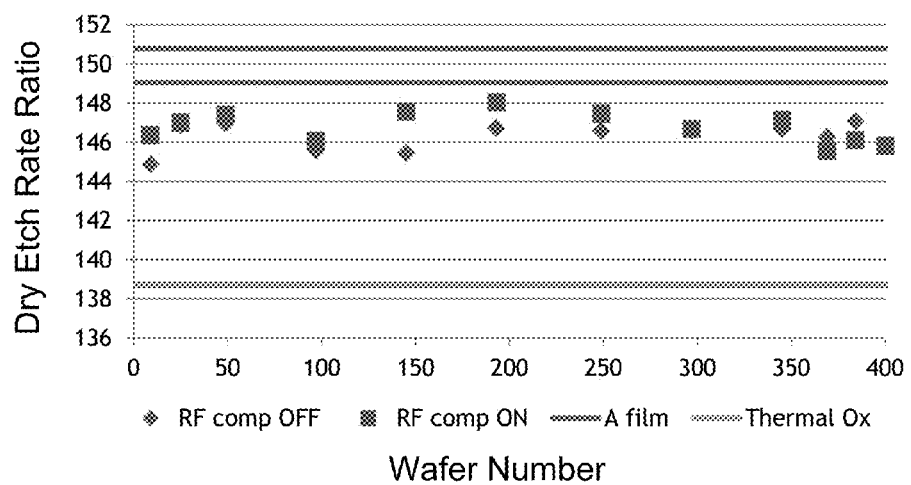
FIG. 15 shows a graph depicting the dry etch rate vs. wafer number for the two batches of FIG. 12.

FIG. 15 presents experimental results related to dry etch rate ratio vs. wafer number for the two 375 substrate batches described in relation to FIGS. 12-14. As noted above with regard to the wet etch rate ratio, the dry etch rate ratio refers to the dry etch rate of the relevant material compared to the dry etch rate of thermal oxide. The dry etch rate ratio did not have an obvious trend in either batch. The variation in the dry etch rate ratio was also nearly unchanged between the two batches. The results show that the disclosed RF compensation methods do not cause any trending in dry etch rates.

FIG. 16 presents additional data related to wet etch rate ratio over the course of two batches, one batch using a constant set RF power (no RF compensation), and one batch using an RF compensation method. Here, the batch size was smaller at about 100 substrates. Where no RF compensation is used, the wet etch rate ratio trends significantly downward over time, with an overall wet etch rate ratio difference of about 0.39. Conversely, where the RF compensation method is employed, the wet etch rate ratio is much more stable, with an overall wet etch rate ratio difference of about 0.08. These results support those shown in FIG. 14 and suggest that RF compensation can be used to significantly reduce the trending of wet etch rate over the course of a batch. Here, the overall wet etch rate ratio difference represents about 1% of the average wet etch rate ratio where RF compensation is used, compared to about 4.9% where no RF compensation is used.

What is claimed is:

1. A method of depositing film on a first batch of substrates in a reaction chamber, the method comprising:
   depositing film on each substrate in the first batch, wherein depositing film on each substrate comprises:
   flowing one or more reactants into the reaction chamber in vapor form, and
   supplying an RF power to generate a plasma and exposing the substrate to the plasma to drive a reaction that deposits the film on the substrate;
   decreasing the RF power per substrate supplied to generate the plasma as additional substrates in the first batch are processed to thereby account for changes in an accumulation of deposited material on interior surfaces of the reaction chamber as the additional substrates are processed, wherein the RF power per substrate supplied to generate the plasma decreases based on a calibration procedure performed prior to depositing film on the substrates in the first batch, the calibration procedure comprising:
   (a) depositing film on a test batch of substrates and recording a resulting film thickness for each substrate in the test batch,
   (b) depositing film on a second set of substrates at various levels of RF power and recording a resulting film thickness for each substrate in the second set of substrates,
   (c) determining a relationship between the RF power and the resulting film thicknesses from operation (b),
   (d) using the relationship from operation (c) and the film thicknesses from operation (a) to determine an effective RF power for the substrates in the test batch, and
   (e) determining a specified RF power to supply to each substrate in one or more future batches based, at least in part, on the effective RF power for the substrates in the test batch.

2. The method of claim 1, wherein the one or more future batches in (e) comprise the first batch.

3. The method of claim 1, wherein the calibration procedure further comprises:
   during (a), depositing film on each substrate in the test batch at a first RF power,
   during (e), determining the specified RF power to supply to each substrate in the one or more future batches by dividing the square of the first RF power by the effective RF power from operation (d) for the substrates in the test batch.

4. The method of claim 1, wherein operation (e) comprises determining a specified RF power to supply to each substrate in the one or more future batches based, at least in part, on a recorded chamber accumulation for the substrates in the test batch in operation (a).

5. The method of claim 4, wherein the specified RF power to supply to each substrate in the one or more future batches is based, at least in part, on chamber accumulation that occurs during the future batch.

6. The method of claim 4, wherein operation (e) further comprises performing a statistical analysis to derive a mathematical relationship between the specified RF power and chamber accumulation, and further comprising using the mathematical relationship to control the RF power supplied during deposition on the substrates in the first batch.

7. The method of claim 6, wherein the mathematical relationship comprises a third degree polynomial relationship.

8. The method of claim 1, wherein the first batch and the test batch each comprise at least about 100 substrates.

9. The method of claim 1, wherein operation (c) comprises performing a statistical analysis to determine a linear relationship between the RF power and the resulting film thicknesses from operation (b).

10. The method of claim 1, wherein the first batch comprises at least about 100 substrates, and wherein the films deposited on the substrates in the first batch have thicknesses that differ by about 1% or less.

11. The method of claim 1, wherein the first batch comprises at least about 100 substrates, and wherein the films deposited on the substrates in the first batch have wet etch rates that differ by about 5% or less.

12. The method of claim 1, further comprising:
   after depositing film on each substrate in the first batch, cleaning the reaction chamber to remove material accumulated on interior surfaces of the reaction chamber.

13. The method of claim 12, further comprising:
after cleaning the reaction chamber, depositing an undercoat on interior surfaces of the reaction chamber.

\* \* \* \* \*